(12) United States Patent
Kim et al.

(10) Patent No.: US 10,796,769 B2
(45) Date of Patent: Oct. 6, 2020

(54) MEMORY DEVICE AND MEMORY SYSTEM HAVING THE SAME

(71) Applicant: SK hynix Inc., Gyeonggi-do (KR)

(72) Inventors: Sang Hwan Kim, Seoul (KR); Min Su Kim, Busan (KR); Kyeong Min Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 57 days.

(21) Appl. No.: 16/299,590

(22) Filed: Mar. 12, 2019

(65) Prior Publication Data

US 2020/0027510 A1    Jan. 23, 2020

(30) Foreign Application Priority Data

Jul. 17, 2018 (KR) ........................ 10-2018-0083126

(51) Int. Cl.
| | |
|---|---|
| *G06F 3/06* | (2006.01) |
| *G11C 16/24* | (2006.01) |
| *H01L 27/11582* | (2017.01) |
| *G11C 16/08* | (2006.01) |
| *G11C 16/30* | (2006.01) |
| *H01L 27/11556* | (2017.01) |

(52) U.S. Cl.
CPC ............ *G11C 16/24* (2013.01); *G06F 3/0604* (2013.01); *G06F 3/0656* (2013.01); *G06F 3/0659* (2013.01); *G06F 3/0679* (2013.01); *G11C 16/08* (2013.01); *G11C 16/30* (2013.01); *H01L 27/11556* (2013.01); *H01L 27/11582* (2013.01)

(58) Field of Classification Search
CPC .......... G06F 3/06; G06F 3/0659; G06F 3/068; G06F 3/0611; G06F 3/0656; G06F 3/0604; G06F 3/0619; G06F 3/0679; G06F 3/0647; G06F 3/0683; G11C 16/24; G11C 16/08; G11C 16/0483; G11C 16/30; G11C 7/106; G11C 2207/2245; G11C 8/12; G11C 7/108; H01L 27/11556; H01L 27/11582
USPC ........................................................ 711/103
See application file for complete search history.

(56) References Cited

U.S. PATENT DOCUMENTS

| | | | |
|---|---|---|---|
| 2013/0163365 A1* | 6/2013 | Lee ........................ | G11C 7/18 365/230.03 |
| 2014/0169094 A1* | 6/2014 | Kim ...................... | G11C 16/26 365/185.12 |
| 2016/0240232 A1* | 8/2016 | Lee ..................... | H01L 27/1052 |
| 2017/0123724 A1* | 5/2017 | Park ..................... | G06F 3/0685 |

FOREIGN PATENT DOCUMENTS

| | | |
|---|---|---|
| KR | 10-2015-0130633 | 11/2015 |
| KR | 10-2017-0022178 | 3/2017 |
| KR | 10-2017-0035288 | 3/2017 |

* cited by examiner

*Primary Examiner* — Mano Padmanabhan
*Assistant Examiner* — Jean C Edouard
(74) *Attorney, Agent, or Firm* — IP & T Group LLP

(57) ABSTRACT

The present disclosure relates to a memory device and a memory system having the same. The memory device includes page buffers arranged in a first direction and a second direction perpendicular to the first direction, a first storage group and a second storage group arranged adjacent to the page buffers in the second direction, and a switch circuit arranged between the first storage group and the second storage group and selectively coupling the first storage group and the second storage group to data lines according to a number of page buffers and a number of first and second storage groups.

18 Claims, 15 Drawing Sheets

MEMORY DEVICE AND MEMORY SYSTEM HAVING THE SAME

CROSS-REFERENCE TO RELATED APPLICATION

The present application claims priority under 35 U.S.C. § 119(a) to Korean patent application number 10-2018-0083126, filed on Jul. 17, 2018, the entire disclosure of which is incorporated herein by reference in its entirety.

BACKGROUND

Field of Invention

Various embodiments of the present invention generally relate to a memory device and a memory system having the same. Particularly, the embodiments relate to a memory device including a storage and a memory system including the memory device.

Description of Related Art

A memory system may include a memory device and a memory controller.

The memory device may store data or output the stored data. For example, the memory device may include a volatile memory device losing stored date when power supply is blocked, or a non-volatile memory device retaining the stored data even when power supply is blocked.

The memory controller may control data communication between a host and a storage device.

The host may communicate with the memory device by using an interface protocol such as Peripheral Component Interconnect-Express (PCI-E), Advanced Technology Attachment (ATA), Serial ATA (SATA), Parallel ATA (PATA), or serial attached SCSI (SAS). However, the interface protocols provided for the purpose of data communication between the host and the memory system may not be limited to the above examples and may include various other interface protocols such as a Universal Serial Bus (USB), a Multi-Media Card (MMC), an Enhanced Small Disk Interface (ESDI), or Integrated Drive Electronics (IDE).

SUMMARY

Various embodiments are directed to a memory device with reduced loading time of a storage unit and a memory system including the memory device.

According to an embodiment, a memory device may include page buffers arranged in a first direction and a second direction perpendicular to the first direction, a first storage group and a second storage group arranged adjacent to the page buffers in the second direction, and a switch circuit arranged between the first storage group and the second storage group and selectively coupling the first storage group and the second storage group to data lines according to a number of page buffers and a number of first and second storage groups.

According to an embodiment, a memory device may include a memory cell array coupled to a plurality of bit lines spaced apart from each other in a first direction and extending in a second direction perpendicular to the first direction, and peripheral circuits located under the memory cell array in a third direction perpendicular to the first and second directions, wherein the peripheral circuits comprise: a plurality of page buffers arranged in a matrix format in the first and second directions and coupled to the plurality of bit lines, respectively, a first storage group coupled to a first group of the page buffers, a second storage group coupled to a second group of the page buffers, and a switch circuit arranged between and coupled to the first and second storage groups, and coupling the first or second storage group to data lines.

According to an embodiment, a memory system may include a memory device storing data, and a memory controller communicating between a host and the memory device, wherein the memory device comprises: page buffers arranged in a first direction and a second direction perpendicular to the first direction, a first storage group and a second storage group arranged adjacent to the page buffers in the second direction, and a switch circuit arranged between the first storage group and the second storage group and coupling a selected storage group between the first and second storage groups to data lines.

According to an embodiment, a memory system may include a memory cell array in row and column directions, one or more column page buffer groups respectively arranged in the column direction under and coupled to the memory cell array, each column page buffer group divided into an upper group and a lower group, one or more first column latch groups respectively arranged in the column direction and respectively coupled to the upper groups, one or more second column latch groups respectively arranged in the column direction and respectively coupled to the lower groups, and one or more switching groups arranged between the first and second column latch groups and having first and second paths respectively to the first and second column latch groups, and configured to alternately couple the first and second column latch groups to data lines, wherein the first and second paths have substantially the same length as each other.

DETAILED DESCRIPTION

Figure 1:
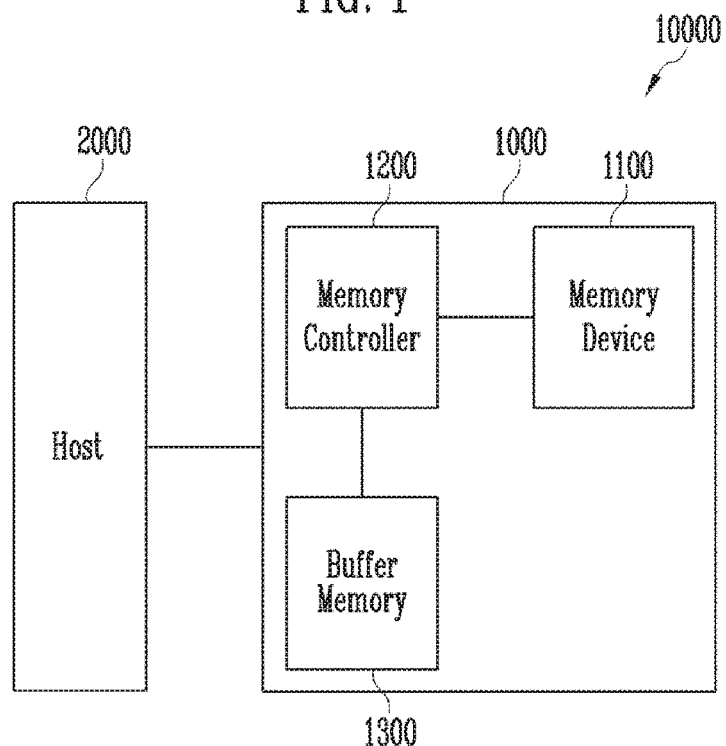
FIG. 1 is a diagram illustrating an electronic system according to an embodiment of the present disclosure.

Example embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art. That is, the technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

FIG. 1 is a diagram illustrating an electronic system 10000 according to an embodiment of the present disclosure.

Referring to FIG. 1, the electronic system 10000 may include a memory system 1000 storing data and a host 2000 controlling the memory system 1000.

The memory system 1000 may include a memory device 1100 storing data, a buffer memory 1300 temporarily storing data necessary for operations of the memory system 1000, and a memory controller 1200 for controlling the memory device 1100 and the buffer memory 1300 in response to control of the host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe or PCI-e), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory controller 1200 may control the operations of the memory system 1000 and control a data exchange between host 2000 and the memory device 1100. For example, the memory controller 1200 may control the memory device 1100 to program or read data in response to a request from the host 2000. In addition, the memory controller 1200 may store information about main memory blocks and sub-memory blocks included in the memory device 1100, and select the memory device 1100 to perform a program operation on a main memory block or a sub-memory block according to the amount of data loaded for the program operation. According to an embodiment, the memory device 1100 may include a flash memory.

The memory controller 1200 may control data exchange between the host 2000 and the buffer memory 1300, or may temporarily store system data for control of the memory device 1100 in the buffer memory 1300. The buffer memory 1300 may serve as an operation memory, a cache memory, or a buffer memory of the memory controller 1200. The buffer memory 1300 may store codes and commands executed by the memory controller 1200. In addition, the buffer memory 1300 may store data processed by the memory controller 1200.

The memory controller 1200 may temporarily store data input from the host 2000 in the buffer memory 1300 and transfer the data temporarily stored in the buffer memory 1300 to the memory device 1100. In addition, the memory controller 1200 may receive data and a logical address from the host 2000 and convert the logical address into a physical address indicating a region where the data is actually stored. In addition, the memory controller 1200 may store a logicalto-physical address mapping table configuring a mapping relationship between the logical address and the physical address in the buffer memory 1300.

By way of example and not limitation, the buffer memory 1300 may include Double Data Rate Synchronous Dynamic Random Access Memory (DDR SDRAM), Low Power Double Data 4 (LPDDR4) SDRAM, Graphics Double Data Rate (GDDR) SDRAM, Low Power DDR (LPDDR), or Rambus Dynamic Random Access Memory (RDRAM).

Figure 2:
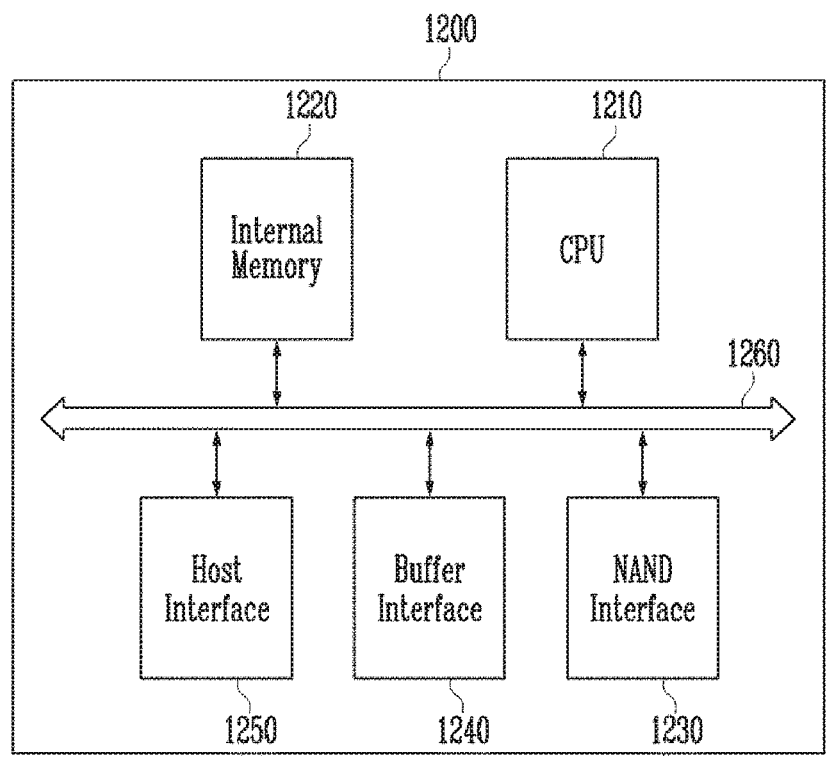
FIG. 2 is a detailed diagram illustrating a memory controller shown in FIG. 1.

FIG. 2 is a detailed diagram illustrating a memory controller, for example, the memory controller 1200 shown in FIG. 1.

Referring to FIG. 2, the memory controller 1200 may include a central processing unit (CPU) 1210, an internal memory 1220, a NAND interface 1230, a buffer interface 1240, a host interface 1250 to control communication between the host 2000 and the memory device 1100. The central processing unit 1210, the internal memory 1220, the NAND interface 1230, the buffer interface 1240 and the host interface 1250 may communicate with each other through a bus 1260.

The central processing unit 1210 may perform various operations to control the memory device 1100, generate a command or an address, or execute firmware. The central processing unit 1210 may control the internal memory 1220, the NAND interface 1230, the buffer interface 1240, and the host interface 1250.

The internal memory 1220 may store various types of system information for operations of the memory controller 1200. For example, the internal memory 1220 may include an SRAM. The internal memory 1220 may store address mapping information for the memory system 1000. For example, a mapping table between a logical address received from the host 2000 and a physical address of the memory device 1100 may be stored in the internal memory 1220.

The NAND interface 1230 may be configured to communicate with the memory device 1100 in response to control of the central processing unit 1210. The NAND interface 1230 may communicate commands, addresses, and data with the memory device 1100 through a channel.

The buffer interface 1240 may communicate with the buffer memory 1300 of FIG. 1 in response to control of the central processing unit 1210.

The host interface 1250 may be configured to communicate with the external host 2000 coupled to the memory system 1000 in response to control of the central processing unit 1210. For example, the host interface 1250 may receive a program external command, data, and a logical address corresponding to the program external command from the host 2000. In addition, the host interface 1250 may receive a read external command and a logical address corresponding to the program external command from the host 2000.

Figure 3:
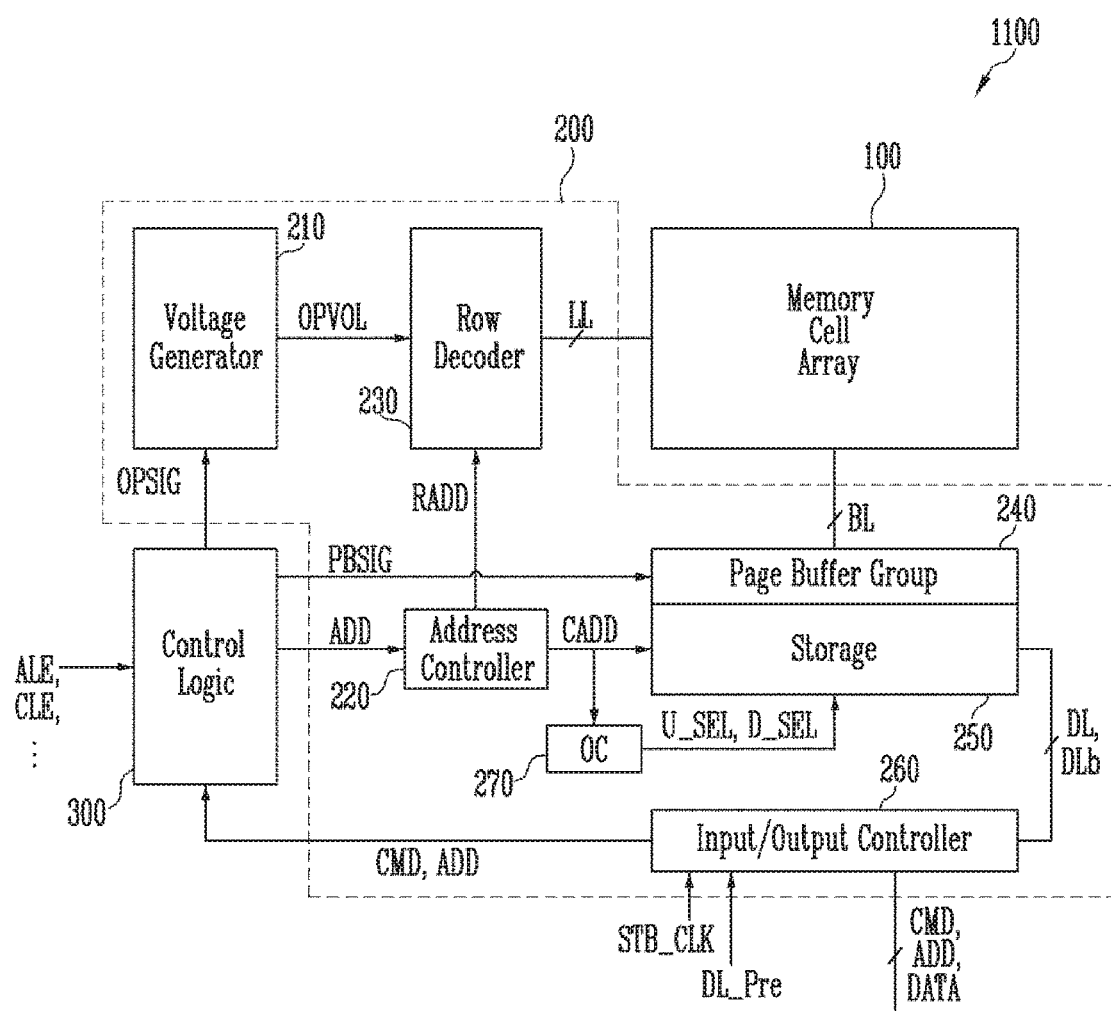
FIG. 3 is a detailed diagram illustrating a memory device according to an embodiment of the present disclosure.

FIG. 3 is a diagram illustrating a memory device, for example, the memory device 1100, according to an embodiment of the present disclosure.

Referring to FIG. 3, the memory device 1100 may include a memory cell array 100 storing data, peripheral circuits 200 performing program, read and erase operations, and a control logic 300 controlling the peripheral circuits 200.

The memory cell array 100 may include a plurality of planes, and each of the planes may include a plurality of memory blocks.

The peripheral circuits 200 may include a voltage generator 210, an address controller 220, a row decoder 230, a page buffer group 240, a storage 250, an input/output controller 260, and an operation component (CAL) 270.

The voltage generator 210 may generate operating voltages OPVOL for operations in response to operating signals OPSIG. For example, the voltage generator 210 may generate a program voltage, a read voltage, an erase voltage, a pass voltage, a turn-on voltage and a turn-off voltage and output these voltages as the operating voltages OPVOL.

The address controller 220 may receive an address ADD from the control logic, and may transfer a row address RADD of the received address ADD to the row decoder 230 and a column address CADD to the storage 250.

The row decoder 230 may receive the operating voltages OPVOL and transfer the operating voltages OPVOL to a selected block in response to the row address RADD. For example, the row decoder 230 may be coupled to the memory cell array 100 through local lines LL and transfer the operation voltages OPVOL through the local lines LL of the selected memory block in response to the row address RADD.

The page buffer group 240 may be coupled to the memory cell array 100 through bit lines BL and temporarily store data. The page buffer group 240 may include a plurality of page buffers, and each of the page buffers may sense voltages or currents in the bit lines BL in response to a page buffer control signal PBSIG output from the control logic 300.

The storage 250 may include storage latches for temporarily storing data and may be coupled to the page buffer group 240. For example, the storage latches may be cache latches. The storage latches may be divided into a plurality of storage groups, and the each of storage groups may be coupled to different one among the page buffers. The storage 250 may transfer data between data lines DL and DLb and the page buffer group 240 in response to the column address CADD, an up-selection signal U_SEL and a down-selection signal D_SEL. For example, the storage 250 may sequentially transfer data between the data lines DL and DLb and the page buffer group 240 in response to the column address CADD. For example, the storage 250 may transfer data to the storage latches or receive data from the storage latches in response to the up-selection signal U_SEL and the down-selection signal D_SEL. The up-selection signal U_SEL and the down-selection signal D_SEL may be output from the control logic 300. Different data may be simultaneously applied to the data line 'DL' and the data line 'DLb'.

The input/output controller 260 may communicate with the memory controller 1200 of FIG. 1 through input/output lines. For example, the input/output controller 260 may receive the command CMD, the address ADD, and data DATA from the memory controller 1200; transfer the command CMD and the address to the control logic 300; and transfer the data DATA to the storage 250 through the data lines DL and DLb. In addition, the input/output circuit 260 may output the data DATA received through the data lines DL and DLb to the memory controller 1200. The input/output controller 260 may input and output the command CMD, the address ADD, and the data DATA in response to a strobe clock STB_CLK used in the memory device 1100. The input/output controller 260 may amplify and output data loaded on the data lines DL and DLb or the input/output lines in response to a data line precharge signal DL_Pre. Pull-up or pull-down circuits may be used for amplifying data. Since various structures of the pull-up and pull-down circuits are disclosed, a detailed description thereof is omitted in this embodiment.

The operation component 270 may output the up-selection signal U_SEL and the down-selection signal D_SEL according to the column address CADD. The operation component 270 may output the up-selection signal U_SEL when transferring data corresponding to a half (½) of the column address CADD and the down-selection signal D_SEL when transferring the data corresponding to the other half. For example, it is assumed that a single page (a group of memory cells coupled to a single word line) has a capacity of eight kilobytes (hereinafter, 8K). The operation component 270 may divide the column address CADD of the data of 8K in half, and may output the up-selection signal U_SEL when transferring data corresponding to first four kilobytes (hereinafter, 4K), and the down-selection signal D_SEL when transferring data to the remaining 4K. The up-selection signal U_SEL and the down-selection signal D_SEL may have the opposite logic values. For example, when the up-selection signal U_SEL of a logic high is output, the down-selection signal D_SEL of a logic low may be output. On the other hand, when the up-selection signal U_SEL of a logic low is output, the down-selection signal D_SEL of a logic high may be output.

As described above, the entire column address CADD may be divided in half, and the up-selection signal U_SEL or the down-selection signal D_SEL may be output according to the divided column address CADD. However, the operation component 270 may selectively output the up-selection signal U_SEL and the down-selection signal D_SEL by various methods. In other words, in this embodiment, to shorten lengths of paths through which data is transferred from the storage 250 including the cache latches to the page buffer group 240, the cache latches may be divided into a first storage group and a second storage group in the storage 250, data may be transferred from the first or second storage group to the page buffer group 240, or the data may be transferred from the page buffer group 240 to the data lines DL and DLb. For example, the operation component 270 may output the up-selection signal U_SEL or the down-selection signal D_SEL according to the arrangement of the page buffers included in the page buffer group 240 and the arrangement of the cache latches in the storage 250. The control logic 300 may receive the command CMD and the address ADD according to a command latch enable signal CLE and an address latch enable signal ALE. For example, the control logic 300 may output the operating signals OPSIG and the page buffer control signal PBSIG in response to the command CMD and may transfer the address ADD to the controller 220.

Figure 4:
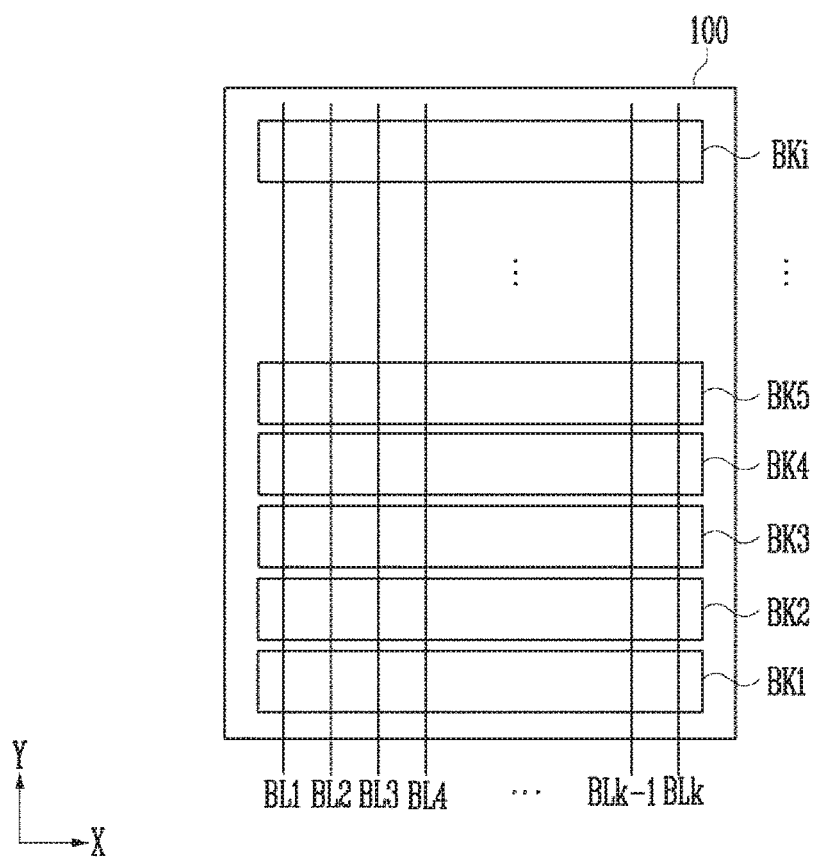
FIG. 4 is a diagram illustrating a memory cell array shown in FIG. 3.

FIG. 4 is a diagram illustrating a memory cell array, for example, the memory cell array 100 shown in FIG. 3.

Referring to FIG. 4, the memory cell array 100 may include a plurality of planes, and each of the planes may include a plurality of memory blocks. FIG. 4 illustrates, as an example, memory blocks BK1 to BKi (where i is a positive integer) included in a single plane as an embodiment.

The memory blocks BK1 to BKi may share bit lines BL1 to BLk (where k is a positive integer). The bit lines BL1 to BLk may be arranged in a first direction X and the memory blocks BK1 to BKi may be arranged in a second direction Y perpendicular to the first direction X. Though not shown in FIG. 4, when the memory cell array 100 includes a plurality of planes, the planes may be arranged in the first direction X.

Figure 5:
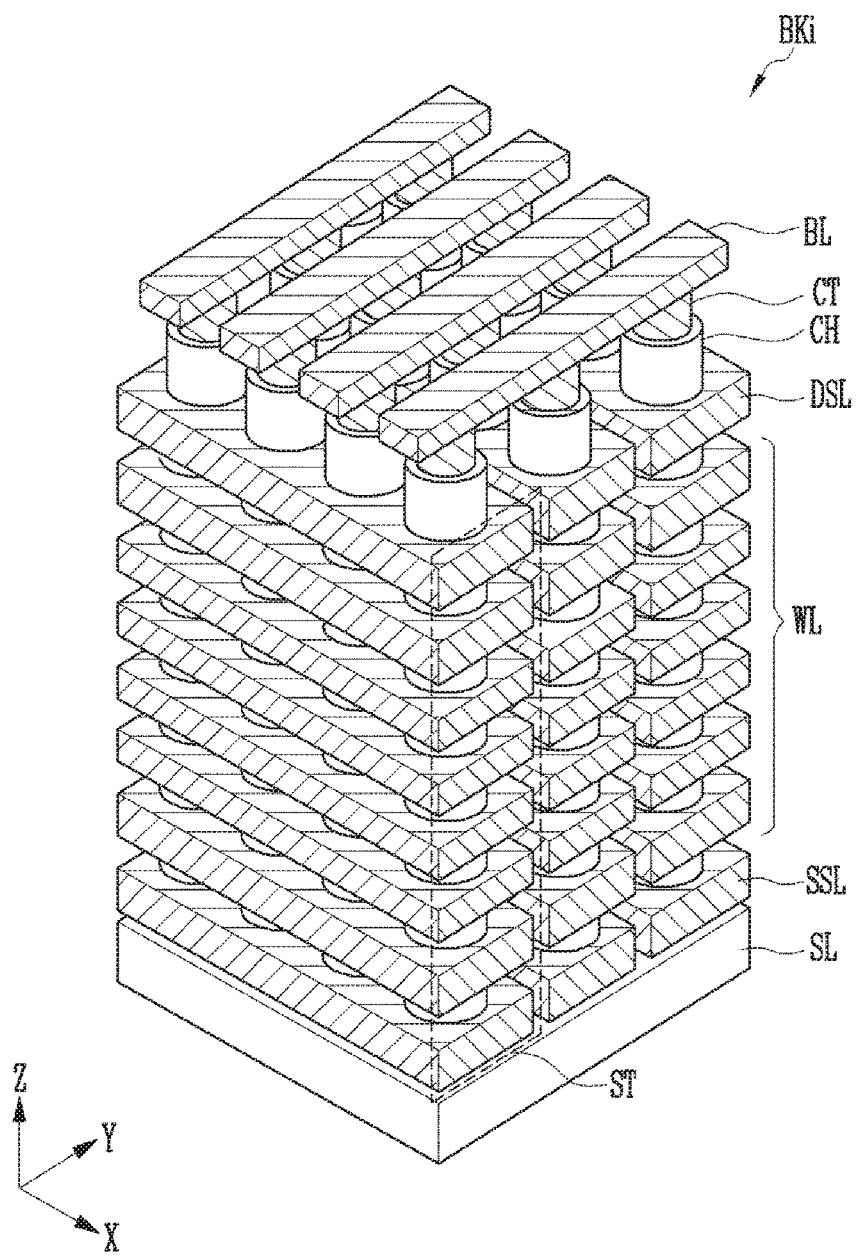
FIG. 5 is a perspective view illustrating an embodiment of a three-dimensionally structured memory block.

FIG. 5 is a perspective view illustrating an embodiment of a three-dimensionally structured memory block BKi.

Referring to FIG. 5, the memory block BKi may correspond to any one among the plurality of memory blocks BK1 to BKi shown in FIG. 4. As illustrated in FIG. 5, the memory block BKi may have a three-dimensional structure.

The memory block BKi having the three-dimensional structure may have an I-shape in a third direction Z perpendicular (Z direction) to a substrate and include a plurality of cell strings ST arranged between bit lines BL and a source line SL. According to an embodiment, a well may be formed instead of the source line SL. This structure may be referred to as a "bit cost scalable" (BiCS) structure. For example, when the source line SL is formed in a horizontal direction to a top of the substrate, the cell strings ST having the BiCS structure may be formed in a vertical direction (Z direction) to a top of the source line SL.

More specifically, the cell strings ST may be arranged in a matrix format in the first direction X and the second direction Y. The cell strings ST may include source select lines SSL, word lines WL, and drain select lines DSL stacked on and separated from each other. The numbers of source select lines SSL, word lines WL and drain select lines DSL may not be limited to those shown in FIG. 5 and may vary according to each memory device 1100. The cell strings ST may include vertical channel layers CH and the bit lines BL. The vertical channel layers CH may vertically pass through the source select lines SSL, the word lines WL and the drain select lines DSL. The bit lines BL may contact top portions of the vertical channel layers CH protruding above top portions of the drain select lines DSL and extend in the second direction Y. Memory cells may be formed between the word lines WL and the vertical channel layers CH. Contact plugs CT may be further formed between the bit lines BL and the vertical channel layers CH.

Figure 6:
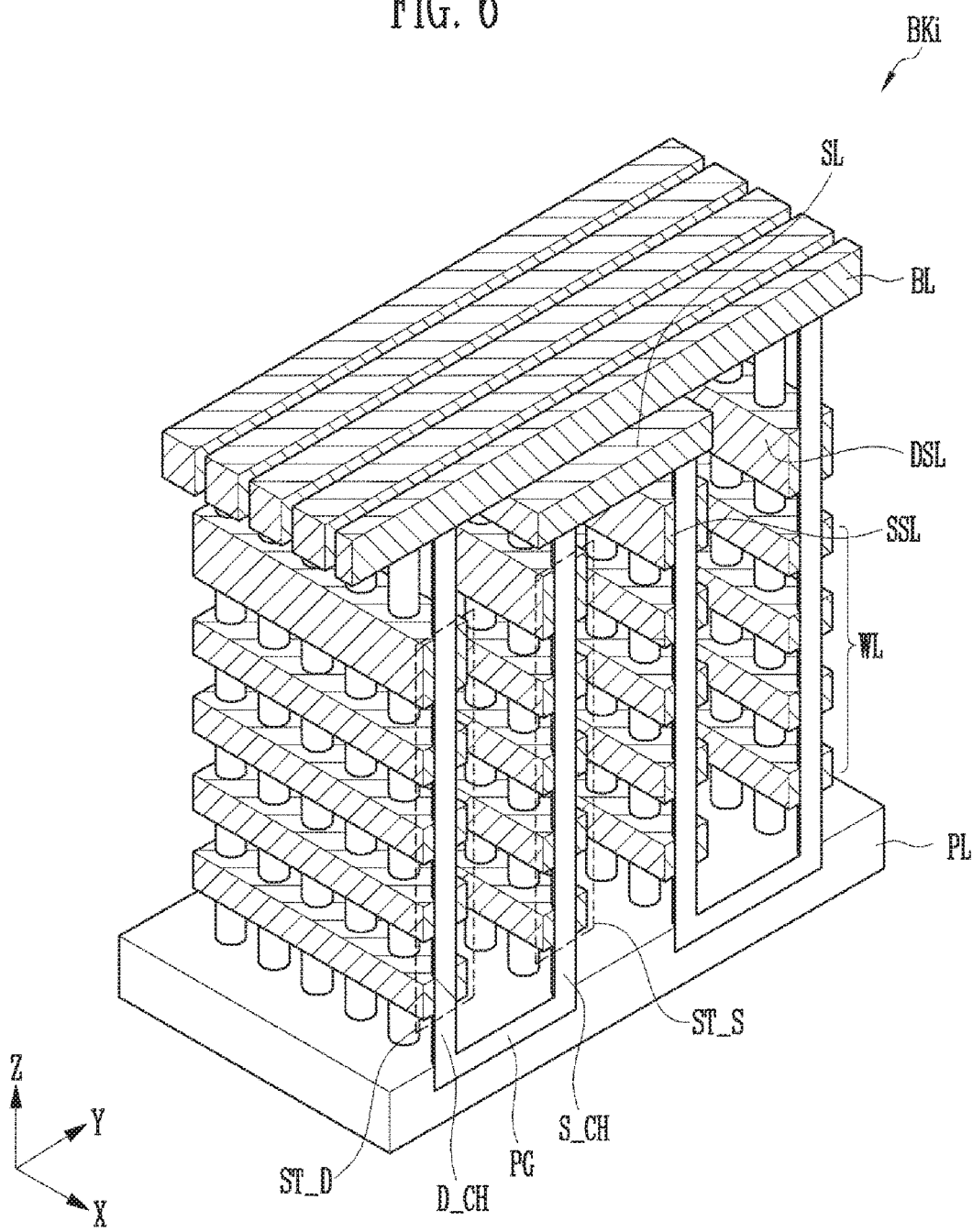
FIG. 6 is a perspective view illustrating another embodiment of a three-dimensionally structured memory block.

FIG. 6 is a perspective view illustrating another embodiment of the three-dimensionally structured memory block BKi.

Referring to FIG. 6, the memory block BKi may correspond to any one among the plurality of memory blocks BK1 to BKi shown in FIG. 4. The memory block BKi of FIG. 6 may have a three-dimensional structure different from that of FIG. 5. The memory block BKi having the three-dimensional structure may be formed in a U-shape extending in the third direction Z perpendicular to the substrate and include source strings ST_S and drain strings ST_D coupled in pairs between the bit lines BL and the source line SL. The source strings ST_S and the drain strings ST_D may be coupled to each other through a pipe gate PG to form a U-shaped structure. The pipe gate PG may be formed in a pipe line PL. More specifically, the source strings ST_S may be vertically formed between the source lines SL and the pipe line PL, and the drain strings ST_D may be vertically formed between the bit lines BL and the pipe line PL. This structure of the above cell string may be referred to as a "Pipe-shaped Bit Cost Scalable" (P-BiCS) structure.

More specifically, the drain strings ST_D and the source strings ST_S may be arranged in the first direction (X) and the second direction (Y) and alternate with each other. The drain strings ST_D may include the word lines WL and the drain select line DSL stacked on and separated from each other, and drain vertical channel layers D_CH vertically penetrating the word lines WL and the drain select line DSL. The source strings ST_D may include the word lines WL and the source select line SSL stacked on and separated from each other, and source vertical channel layers S_CH vertically penetrating the word lines WL and the source select line DSL. The drain vertical channel layers D_CH and the source vertical channel layers S_CH may be coupled to each other through the pipe gate PG in the pipe line PL. The bit lines BL may contact top portions of the drain vertical channel layers D_CH protruding above the drain select line DSL and extend in the second direction (Y direction).

It is to be noted that the structures of the memory block BKi shown in FIGS. 5 and 6 are merely examples, and the present invention is not limited thereto. That is, the memory blocks BKi may have various other structures depending on design.

Figure 7:
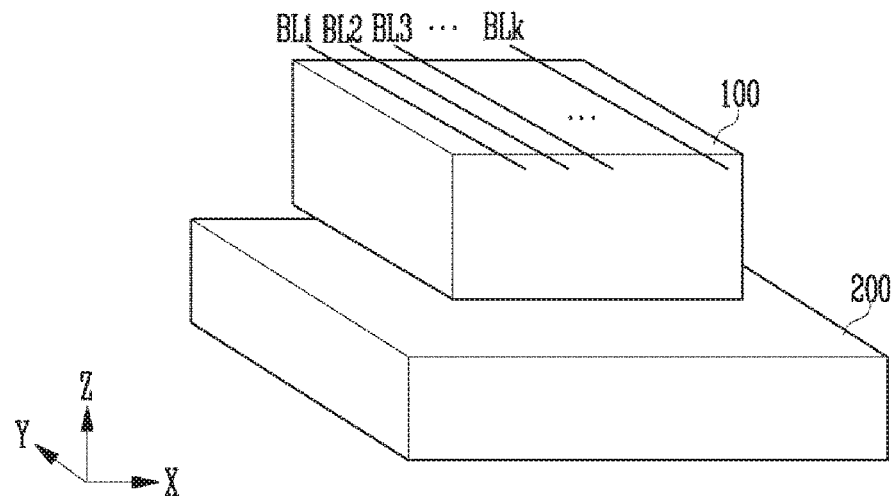
FIG. 7 is a perspective view illustrating a memory device having a peri under cell (PUC) structure.

FIG. 7 is a perspective view illustrating the memory device 1100 having a "peri-under-cell" (PUC) structure.

Referring to FIG. 7, the memory cell array 100 may be formed above the peripheral circuits 200 to reduce the size of the memory device 1100. This structure in which the memory cell array 100 is formed on top of the peripheral circuits 200 is referred to as the PUC structure. For example, on the assumption that the bit lines BL1 to BLk coupled to the memory cell array 100 extend in the second direction (Y) and are separated from each other in the first direction (X), the memory cell array 100 may be formed on top of the peripheral circuits 200 in the third direction (Z). Therefore, the bit lines BL1 to BLk may be coupled to the peripheral circuits 200 in the third direction (Z).

Figure 8:
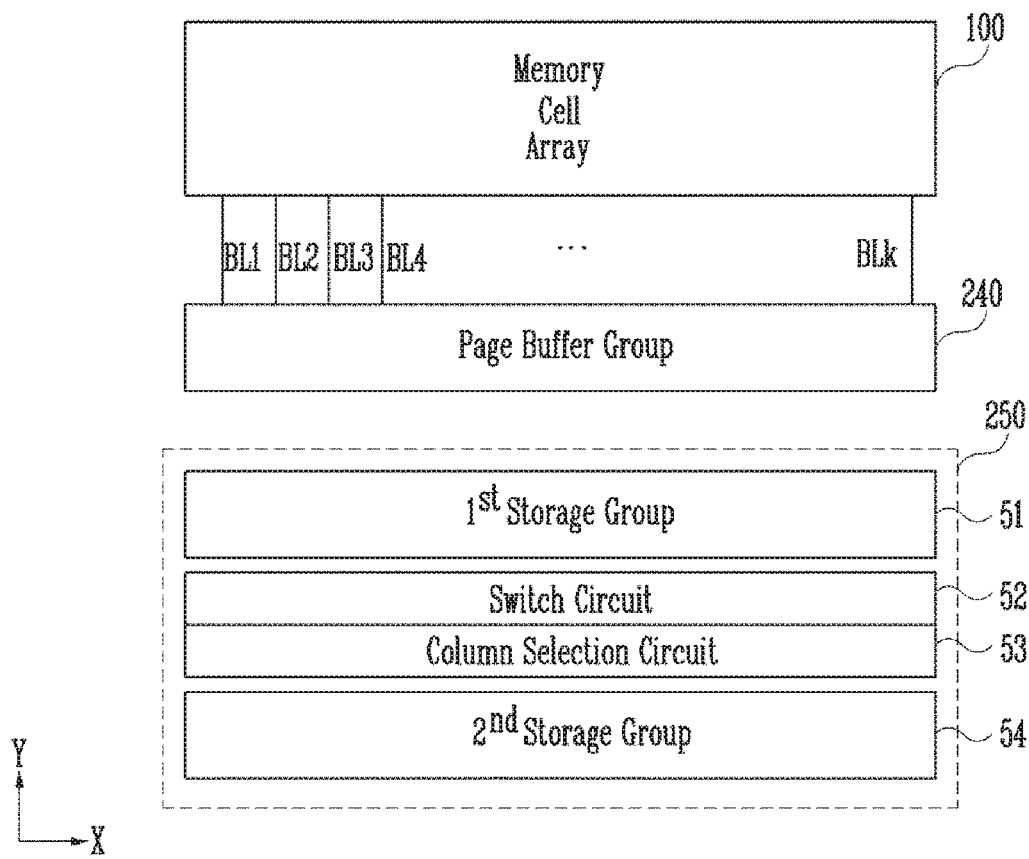
FIG. 8 is a diagram illustrating a page buffer group and a storage according to an embodiment of the present disclosure.

FIG. 8 is a diagram illustrating the page buffer group 240 and the storage 250 according to an embodiment of the present disclosure.

Referring to FIG. 8, the page buffer group 240 may be coupled to the memory cell array 100 through the bit lines BL1 to BLk. For example, the page buffer group 240 may include a plurality of page buffers coupled to the bit lines BL1 to BLk.

The storage 250 may include first and second storage groups 51 and 54, a switch circuit 52 and a column selection circuit 53. Although FIG. 8 illustrates the two storage groups 51 and 54 for convenience of explanation of an embodiment, the number of storage groups is not limited thereto.

Storage latches respectively coupled to the page buffers may be included in the first and second storage groups 51 and 54. For example, the storage latches may be cache latches. The first and second storage groups 51 and 54 together may correspond to a conventional single storage group. A switch circuit 52 may be arranged between the first and second storage groups 51 and 54. In this embodiment, the position of the column selection circuit 53 may not be limited. In this embodiment, the second storage group 54, the switch circuit 52, and the first storage group 51 may be sequentially arranged in the second direction Y.

The configurations of the page buffer group 240 and the storage 250 are described below in more detail.

Figure 9:
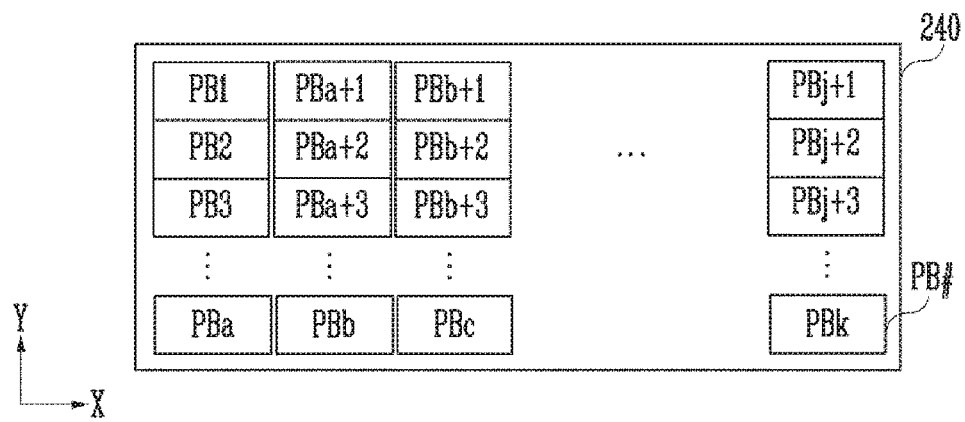
FIG. 9 is a diagram illustrating a page buffer group shown in FIG. 8.

FIG. 9 is a diagram illustrating the page buffer group 240 shown in FIG. 8.

Referring to FIG. 9, the page buffer group 240 may include first to kth page buffers PB1 to PBk. The first to kth page buffers PB1 to PBk may be arranged in the first and second directions X and Y. For example, the first to ath page buffers PB1 to PBa may be arranged in the second direction Y and (a+1)th to bth page buffers PBa+1 to PBb may also be arranged in the second direction Y, where a is a positive integer. The (a+1)th to bth page buffers PBa+1 to PBb may be arranged adjacent to the page buffers PB1 to PBa in the first direction X. In this manner, the (b+1)th to cth page buffers PBb+1 to PBc may be arranged adjacent to the page buffers PBa+1 to PBb in the first direction X. In this manner, the first to kth page buffers PB1 to PBk may be arranged in the first and second directions X and Y. In FIG. 9, k is a positive integer greater than j, j is a positive integer greater than c, c is a positive integer greater than b and b is a positive integer greater than a.

The connections of the above-described page buffers (PB #) will be described below in detail.

Figure 10:
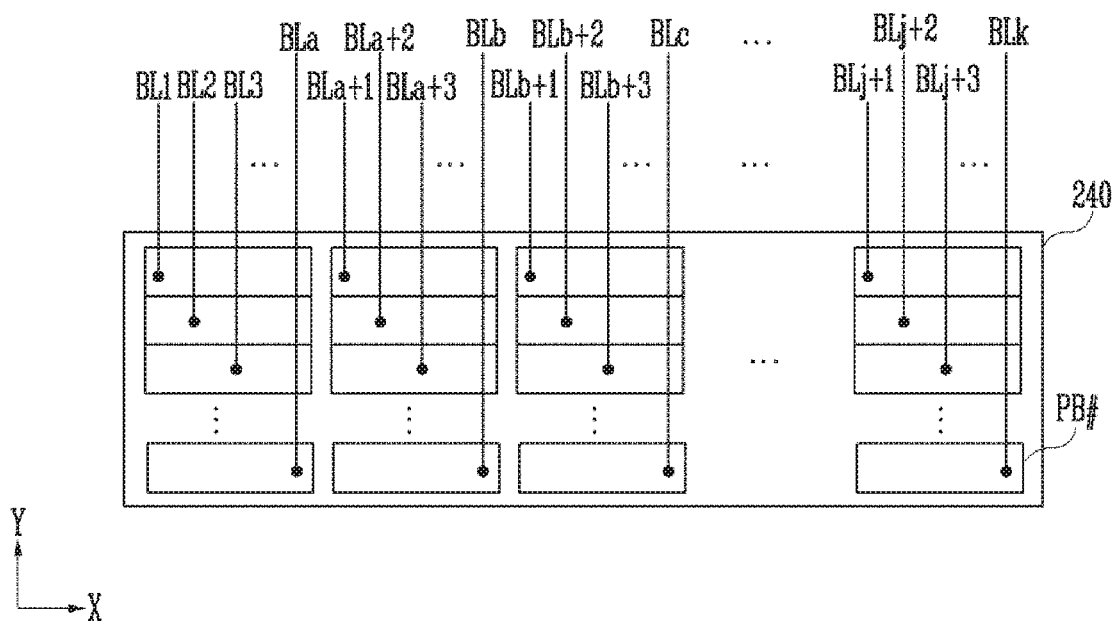
FIG. 10 is a diagram illustrating connections between page buffers of FIG. 9.

FIG. 10 is a diagram illustrating connections between the first to kth page buffers PB1 to PBk shown in FIG. 9.

Referring to FIGS. 9 and 10, the first to kth page buffers PB1 to PBk may be coupled to first to kth bit lines BL1 to BLk, respectively. For example, the first page buffer PB1 may be coupled to the first bit line BL1, and the second page buffer PB2 may be coupled to the second bit line BL2. In terms of the order in which the bit lines are arranged, when an (a+1)th bit line BLa+1 is adjacent to an ath bit line BLa, the ath bit line BLa may be coupled to the ath page buffer PBa and the (a+1)th bit line BLa+1 may be coupled to the (a+1)th page buffer PBa+1. In other words, the first to kth bit lines BL1 to BLk arranged in the first direction X may be coupled to the first to kth page buffers PB1 to PBk arranged in the first and second directions X and Y, respectively.

Figure 11:
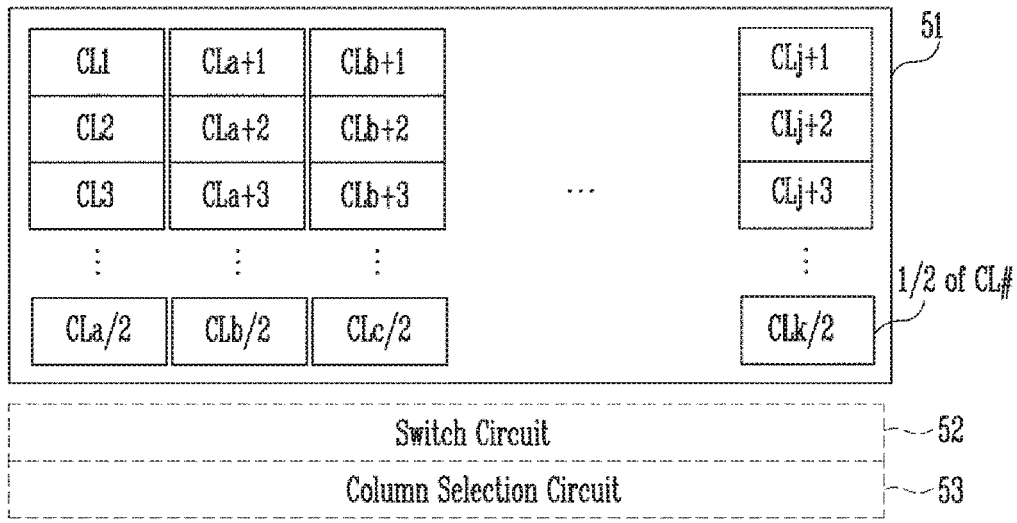
FIG. 11 is a diagram illustrating first and second storage groups of FIG. 8.

FIG. 11 is a diagram illustrating the first and second storage groups 51 and 54 shown in FIG. 8.

Referring to FIGS. 9 and 11, the first and second storage groups 51 and 54 may include the storage latches (CL #) coupled to the page buffers (PB #). For example, the storage latches CL # may be divided into two groups such as the first and second storage groups 51 and 54. The first storage group 51 may include some storage latches (½ of CL #) and the second storage group 54 may include the other storage latches (½ of CL #), among the storage latches CL1 to CLk respectively coupled to the first to kth page buffers PB1 to PBk. For example, on the assumption that the first to kth page buffers PB1 to PBk are divided into two groups in the second direction Y, one group of the page buffers may be coupled to the first storage group 51, and the other group of the page buffers may be coupled to the second storage group 54.

More specifically, the first storage group 51 may include first to a/2th storage latches CL1 to CLa/2, (a+1)th to b/2th storage latches CLa+1 to CLb/2, (b+1)th to c/2th storage latches CLb+1 to CLc/2, and (j+1)th to k/2th storage latches CLj+1 to CLk/2. The second storage group 54 may include {(a/2)+1}th to ath storage latches CLa/2+1 to CLa, {(b/2)+1}th to bth storage latches CLb/2+1 to CLb, {(c/2)+1}th to cth storage latches CLc/2+1 to CLc, and {(k/2)+1}th to kth storage latches CLk/2+1 to CLk.

The switch circuit 52 may be arranged between the first storage group 51 and the second storage group 54. Although FIG. 11 illustrates that the column selection circuit 53 is arranged between the first storage group 51 and the second storage group 54, it is to be noted that the position of the column selection circuit 53 may not be limited to a particular position. For example, the column selection circuit 53 may be arranged between the first storage group 51 and the second storage group 54, or under the second storage group 54 in the second direction Y.

Figure 12:
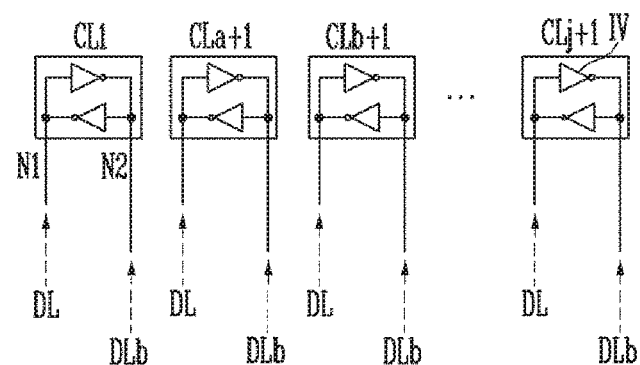
FIG. 12 is a diagram illustrating connections between storage latches of FIG. 11.

FIG. 12 is a diagram illustrating connections between the storage latches shown in FIG. 11.

Referring to FIG. 12, each of the storage latches may include two inverters IV. Storage latches CL1, CLa+1, CLb+1 to CLj+1 included in one row, among the storage latches shown in FIG. 11, will be described below as an example.

The storage latches CL1, CLa+1, CLb+1 to CLj+1 may transfer data loaded onto the data lines DL and DLb to different page buffers, or data received from the page buffers to the data lines DL and DLb.

Each of the storage latches CL1, CLa+1, CLb+1 to CLj+1 may include an inverter having a first node N1 as an input terminal and a second node N2 as an output terminal, and an inverter having the first node N1 as an output terminal and the second node N2 as an input terminal. The data loaded onto the data line DL may be transferred through the first nodes N1 and the data loaded onto the data line DLb may be transferred through the second nodes N2. In addition, the storage latches CL1, CLa+1, CLb+1 to CLj+1 may be coupled to the page buffers, respectively, through the first nodes N1 or the second nodes N2.

The data lines DL and DLb and the storage latches CL1, CLa+1, CLb+1 to CLj+1 may not be directly coupled to each other but may be coupled to each other through switch circuits. This will be described below with reference to FIG. 13.

Figure 13:
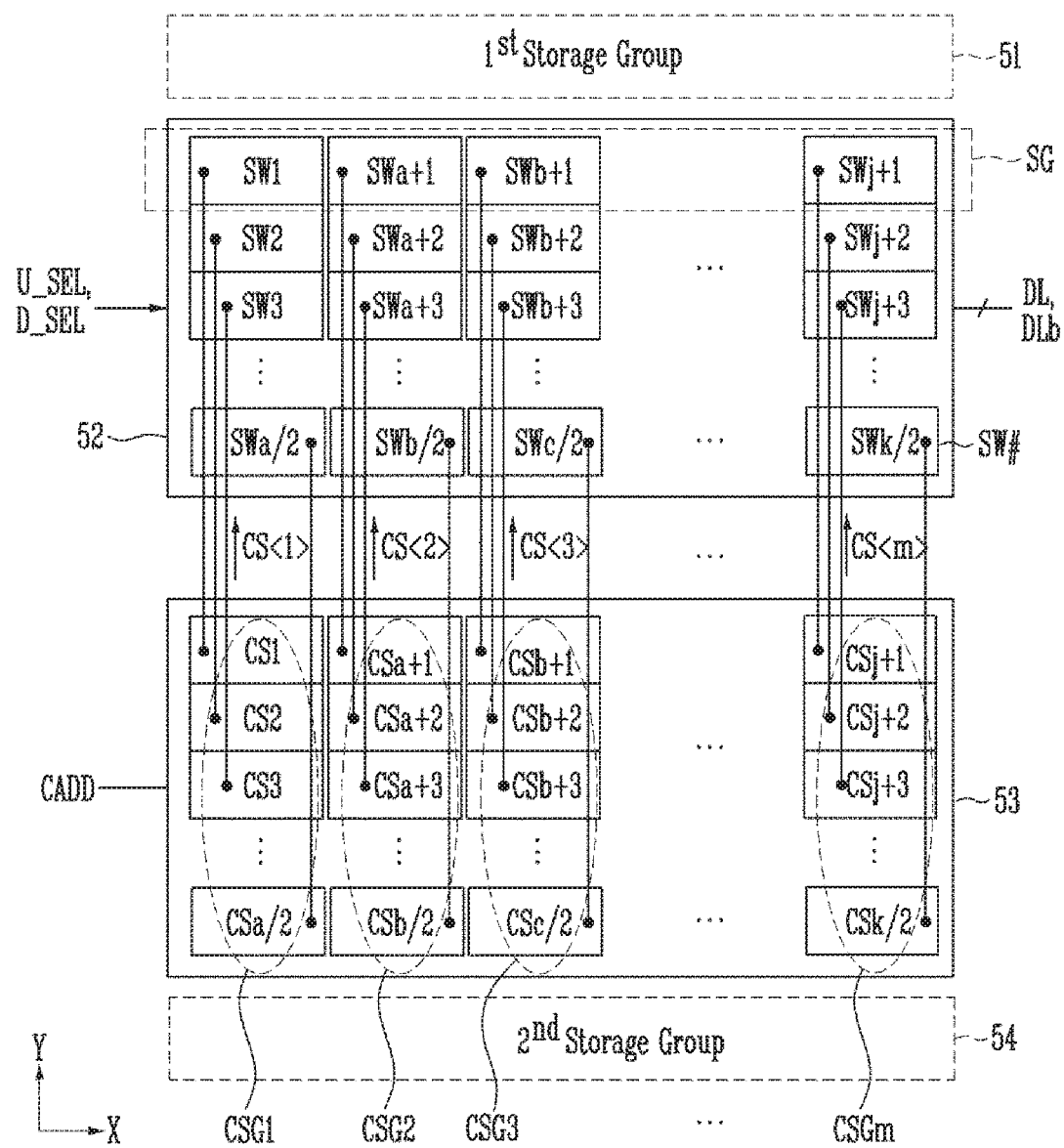
FIG. 13 is a diagram illustrating a switch circuit and a column selection circuit of FIG. 8.

FIG. 13 is a diagram illustrating the switch circuit 52 and the column selection circuit 53 shown in FIG. 8.

Referring to FIG. 13, the switch circuit 52 may include a plurality of switches SW1 to SWk/2. The switches SW1 to SWk/2 may be arranged in the same manner as the storage latches included in the first storage group 51 or the second storage group 54 are arranged, as described with reference to FIG. 11. For example, the first to a/2th switches SW1 to SWa/2 may be arranged in the second direction Y, and (a+1)th to b/2th switches SWa+1 to SWb/2 may be arranged in the second direction Y. On the assumption that the first to a/2th switches SW1 to SWa/2 belong to one group and the (a+1)th to b/2th switches SWa+1 to SWb/2 belong to the other group, these groups may be arranged adjacent to each other in the first direction X. In this manner, the first to a/2th switches SW1 to SWa/2 may be arranged in a matrix format.

The column selection circuit 53 may include first to mth column selection circuit groups CSG1 to CSGm that output column selection signals CS<1:m> in response to the column address CADD. For example, the column selection circuit 53 may include a plurality of column selection circuits CS1 to CSk/2 that are arranged in the same manner as the switches SW1 to SWk/2 included in the switch circuit 52. The plurality of column selection circuits CS1 to CSk/2 may be divided into the column selection circuit groups CSG1 to CSGm column by column in the arrangement of the first to k/2th column selection circuits CS1 to CSk/2. The column selection circuit groups CSG1 to CSGm may sequentially output the column selection signals CS<1:m> in response to the column address CADD. Each of the column selection circuit groups CSG1 to CSGm may include a plurality of selection circuits. In an example of the first column selection circuit group CSG1, the first column selection circuit CS1 may transfer the first column selection signal CS<1> to the first switch SW1 in response to the column address CADD. In other words, in an example of the first column selection circuit group CSG1, after the first column selection circuit CS1 transfers the first column selection signal CS<1> to the first switch SW1, the second column selection circuit CS2 may transfer the second first column selection signal CS<1> to the second switch SW2. In this manner, the first to a/2th switches SW1 to SWa/2 may be sequentially selected.

Since the first storage group 51 and the second storage group 54 are separated from each other and the switch circuit 52 transfers data by selecting the first storage group 51 or the second storage group 54, the first column selection signal CS<1> may be output again in order to transfer data to the second storage group 54 after the data is transferred to the first storage group 51. More specifically, on the assumption that first to twentieth column addresses are sequentially output, the up-selection signal U_SEL may be enabled when first to tenth column addresses are output, and the switch circuit 52 may sequentially transfer data to the first storage group 51 by the up-selection signal U_SEL. Subsequently, since the down-selection signal D_SEL is enabled when eleventh to twentieth column addresses are output, the switch circuit 52 may sequentially transfer data to the second storage group 54 by the down-selection signal D_SEL. In other words, two column addresses may be applied to the first column selection circuit CS1 at different times, and data corresponding to each column address may be transferred to the first storage group 51 or the second storage group 54 according to the up-selection signal U_SEL or the down-selection signal D_SEL.

When the first column selection signals CS<1> are output from all first to a/2 column selection circuits CS1 to CSa/2 of the first column selection circuit group CSG1, the (a+1)th to b/2th column selection circuits CSa+1 to CSb/2 of the second column selection circuit group CSG2 may sequentially transfer second column selection signals CS<2> for sequentially selecting the (a+1)th to b/2th switches SWa+1 to SWb/2. In this manner, the first to k/2th column selection circuits CS1 to CSk/2 in the column selection circuit groups CSG1 to CSGm may sequentially output the first to mth column selection signals CS<1:m> in response to the column address CADD.

The first to k/2 switches SW1 to SWk/2 may selectively couple one between the first storage group 51 and the second storage group 54 to the data lines DL and DLb in response to the up-selection signal U_SEL and the down-selection signal D_SEL. In other words, the first to k/2 switches SW1 to SWk/2 may select the first storage group 51 when the up-selection signal U_SEL is enabled, and the second storage group 54 when the down-selection signal D_SEL is enabled. Therefore, switches selected according to the column selection signals CS<1:m> and the up-selection signal U_SEL or the down-selection signal D_SEL may couple the first or second storage group 51 or 54 to the data lines DL and DLb.

For example, when the first column selection signal CS<1> is output from the first selection circuit CS1 among the selection circuits CS1 to CSa/2 included in the first column selection circuit group CSG1, the first switch SW1 may be selected. When the down-selection signal D_SEL is disabled and the up-selection signal U_SEL is enabled, the first switch SW1 may couple the data lines DL and DLb to the selected storage latch of the first storage group 51. The up-selection signal U_SEL and the down-selection signal D_SEL may be output from the operation component 270 of FIG. 3. For example, the operation component 270 may divide the number of page buffers (PB #) arranged in the second direction Y by a half on the basis of the column address and may selectively output the up-selection signal U_SEL and the down-selection signal D_SEL according to half of the number of page buffers.

For example, on the assumption that ten page buffers (PB #) are arranged in the second direction Y, the operation component 270 may enable the up-selection signal U_SEL so that 5-bit data may be input to five page buffers corresponding to a half of the ten page buffers when five column addresses are output. When the five column addresses are all output, the operation component 270 may enable the down-selection signal D_SEL while the remaining five column addresses are output. After the down-selection signal D_SEL is output, the operation component 270 may enable again the up-selection signal U_SEL when next five column addresses are output. In this manner, the operation component 270 may alternately enable the up-selection signal U_SEL and the down-selection signal D_SEL according to column addresses. Therefore, data input to the switch circuit 52 may be transferred to the first storage group 51 when the up-selection signal U_SEL is enabled, and to the second storage group 54 when the down-selection signal D_SEL is enabled. To more specifically describe the connecting relationship between the switches and the storage latches, a group of switches arranged in the same row (hereinafter, a switch group SG) will be described below as an example.

Figure 14:
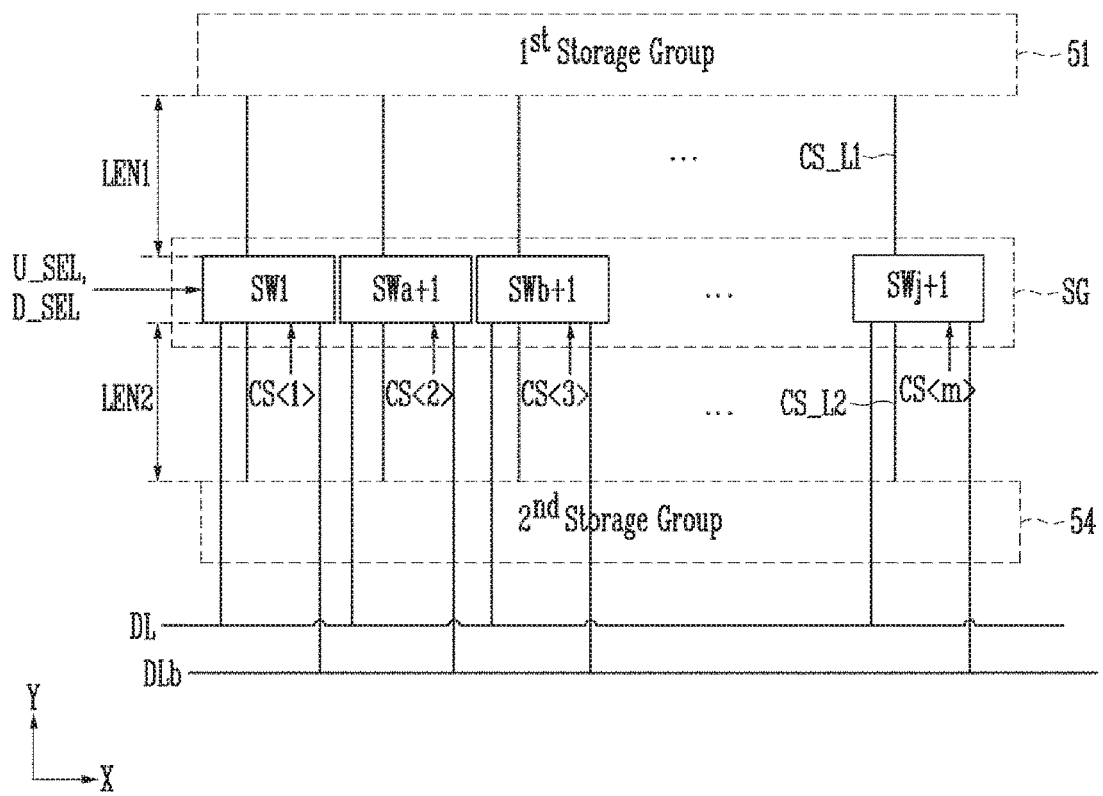
FIG. 14 is a diagram illustrating connections between switches of FIG. 13.

FIG. 14 is a diagram illustrating connections between switches shown in FIG. 13.

Referring to FIG. 14, switches SW1, SWa+1, SWb+1 to SWj+1 included in the storage group SG may be commonly coupled to the data lines DL and DLb, be coupled to the first storage group 51 through first cache lines CS_L1, and may be coupled to the second storage group 54 through second cache lines CS_L2. As described above, when a single storage group is divided into the first storage group 51 and the second storage group 54, and the storage group SG is arranged between the first storage group 51 and the second storage group 54, a length LEN1 of the first cache lines CS_L1 and a length LEN2 of the second cache lines CS_L2 may be the same or similar to each other. In other words, conventional cache lines having a length corresponding to a sum of the first and second cache lines CS_L1 and CS_L2 may cause longer data loading time. However, since cache lines of this embodiment are shorter than the conventional ones, data loading time may be shortened.

A data transfer method is described below.

When the up-selection signal U_SEL is enabled and the down-selection signal D_SEL is disabled, if the first column selection signal CS<1> is enabled and the remaining second to mth column selection signals CS<m:2> are disabled, only the first switch SW1 may be enabled. As a result, the data lines DL and DLb may be coupled to the first storage group 51. Therefore, during a program operation, data loaded onto the data lines DL and DLb may be transferred to the first storage group 51, and during a read operation, data loaded onto the first storage group 51 may be transferred to the data lines DL and DLb.

Figure 15:
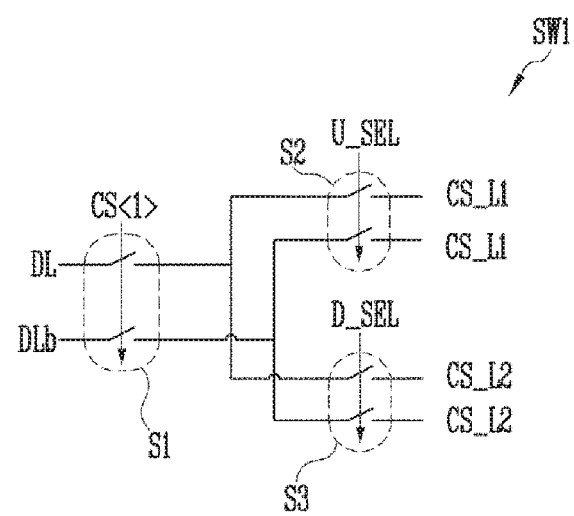
FIG. 15 is a circuit diagram illustrating an embodiment of one of switches shown in FIG. 14.

FIG. 15 is a circuit diagram illustrating an embodiment of one of the switches shown in FIG. 14. Since the switches SW1, SWa+1, SWb+1 to SWj+1 of FIG. 14 have the same structure, only the first switch SW1 is described as an example for convenience of description and illustrative purpose.

Referring to FIG. 15, the first switch SW1 may include first to third switch devices S1 to S3.

The first switch devices S1 may be configured to couple the data lines DL and DLb to the second and third switch devices S2 and S3 in response to the column selection signal CS<1>. The second switch devices S2 may be configured to couple the data lines DL and DLb and the first cache lines CS_L1 to each other in response to the up-selection signal U_SEL. The third switch devices S3 may be configured to couple the data lines DL and DLb and the second cache lines CS_L2 to each other in response to the down-selection signal D_SEL. Only one of the up-selection signal U_SEL and the down-selection signal D_SEL may be enabled, and the up-selection signal U_SEL and the down-selection signal D_SEL may not be enabled at the same time. However, the up-selection signal U_SEL and the down-selection signal D_SEL may be disabled at the same time.

Therefore, when the up-selection signal U_SEL is enabled, the down-selection signal D_SEL may be disabled so that the data lines DL and DLb may be coupled to the first cache lines CS_L1. On the other hand, when the down-selection signal D_SEL is enabled, the up-selection signal U_SEL may be disabled so that the data lines DL and DLb may be coupled to the second cache lines CS_L2.

Figure 16:
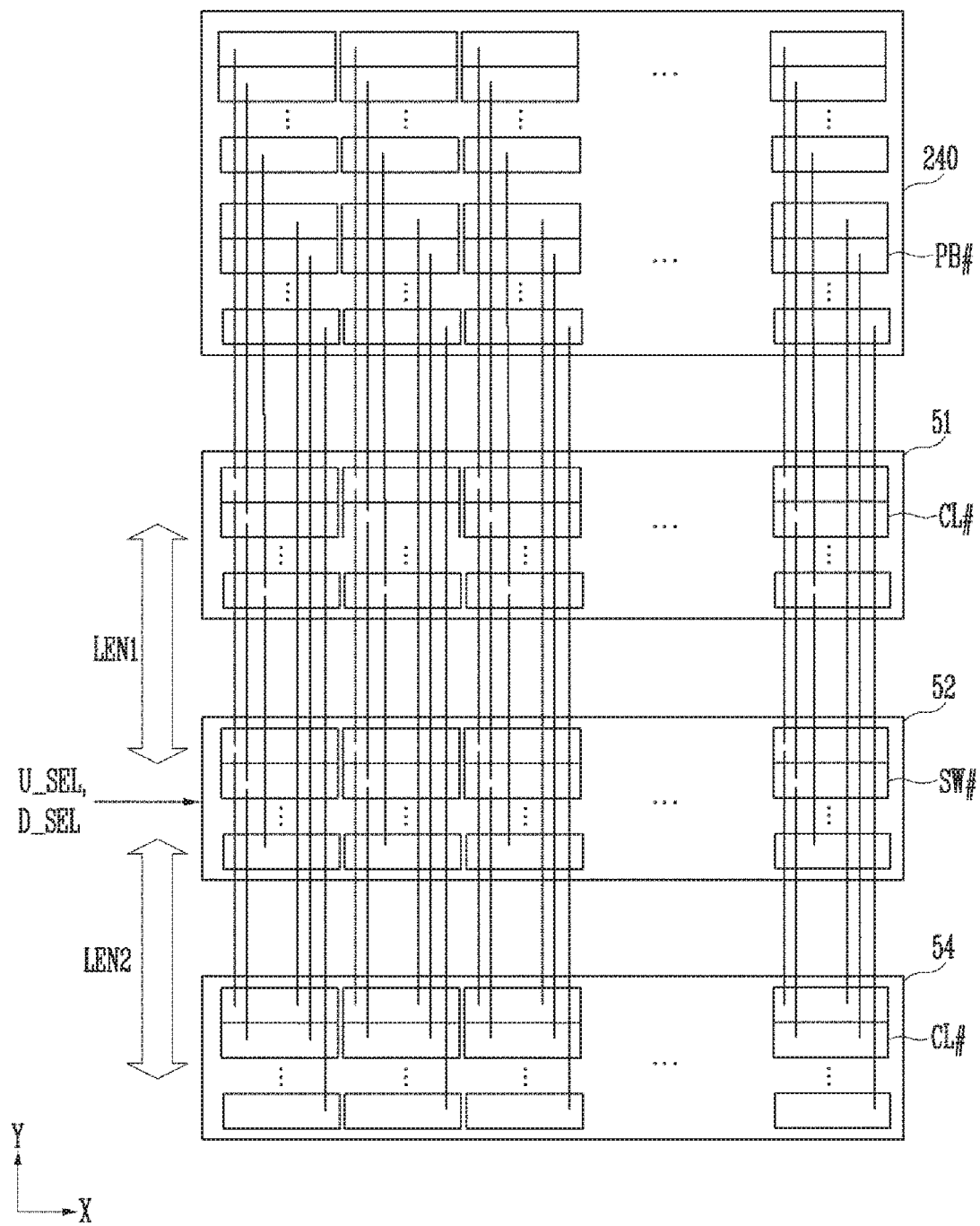
FIG. 16 is a diagram illustrating connections between a page buffer group, first and second storage groups and a switch circuit according to an embodiment of the present disclosure.

FIG. 16 is a diagram illustrating connections between the page buffer group 240, the first and second storage groups 51 and 54 and the switch circuit 52 according to an embodiment of the present disclosure.

The page buffer group 240, the first storage group 51, the switch circuit 52, and the second storage group 54 may be coupled to each other as shown in FIG. 16 when the drawings of FIGS. 8 to 15 are combined.

More specifically, the switches SW # included in the switch circuit 52 may be coupled to the storage latches CL #included in the first storage group 51 and the second storage group 54, respectively, and may select the storage latches CL # included in one between the first and second storage group 51 and 54 in response to the up-selection signal U_SEL and the down-selection signal D_SEL. Since the switch circuit 52 is arranged between the first storage group 51 and the second storage group 54, the length LEN1 of the cache lines coupling the switch circuit 52 to the first storage group 51 may be the same as the length LEN2 coupling the switch circuit 52 to the second storage group 54. Therefore, data transmission and reception time through the first storage group 51 and data transmission and reception time through the second storage group 54 may be similar to each other.

The storage latches CL # included in the first storage group 51 may be coupled to some page buffers PB # included in the page buffer group 240 and the storage latches CL # included in the second storage group 54 may be coupled to the other page buffers PB # included in the page buffer group 240. For example, the page buffers PB # arranged in the second direction Y may be divided into two groups. An upper group of the page buffers PB # located at the upper side on the basis of the second direction Y may be coupled to the first storage group 51 and a lower group of the page buffers PB # located at the lower side may be coupled to the second storage group 54.

Figure 17:
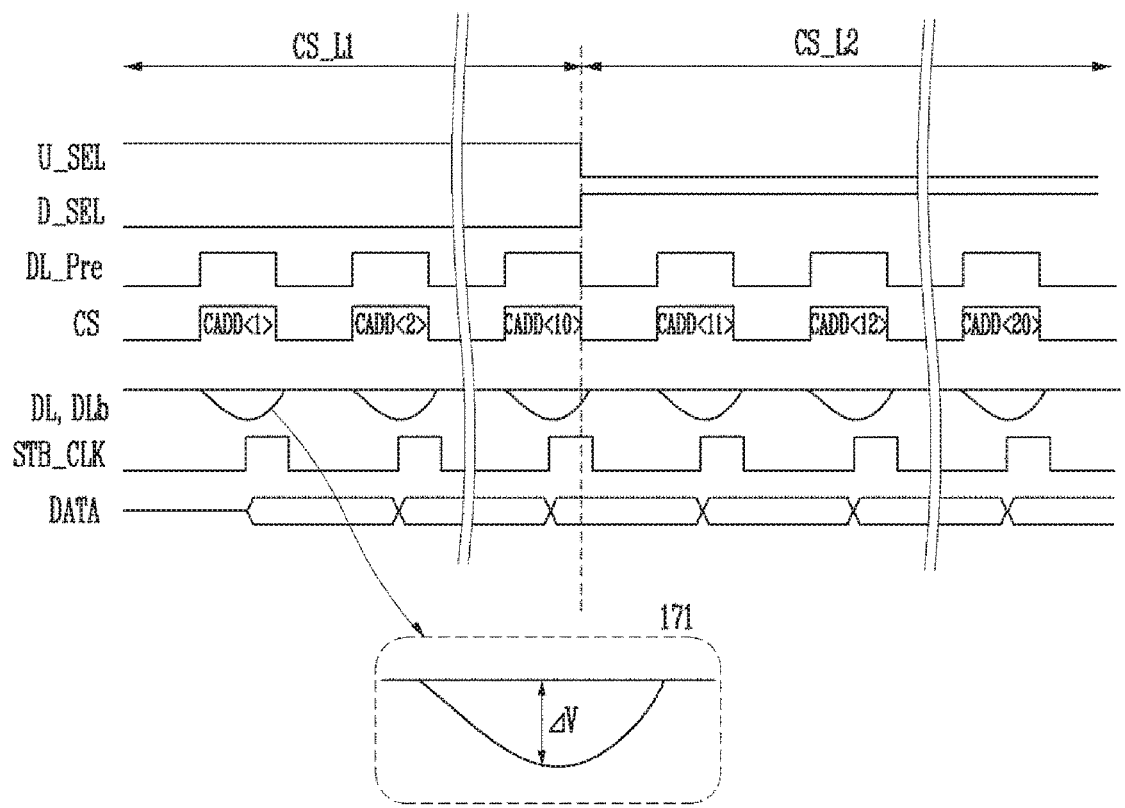
FIG. 17 is a timing diagram illustrating a data transfer method according to an embodiment of the present disclosure.

FIG. 17 is a timing diagram illustrating a data transfer method according to an embodiment of the present disclosure.

Referring to FIG. 17, a method of transferring data loaded onto the data lines DL and DLb to the storage latches during a program operation is illustrated.

When the up-selection signal U_SEL is enabled to a high level according to the column address CADD, the down-selection signal D_SEL may be disabled to a low level and the first cache lines CS_L1 may be selected.

For example, when the data DATA corresponding to column addresses CADD1 to CADD20 is transferred, the data DATA may be transferred to the first storage group 51 in response to the first to tenth column addresses CADD1 to CADD10 sequentially input when the first cache lines CS_L1 are selected. More specifically, the data DATA may be loaded onto the data lines DL and DLb in response to a data line precharge signal DL_Pre. The data DATA may be transferred to the first storage group 51 through the first cache lines CS_L1 in response to the first column address CADD1. Since the first cache lines CS_L1 have a uniform length, a time ΔV 171 during which data are loaded onto the data lines DL and DLb may be shortened, and a difference in time ΔV 171 for loading data may be reduced. The data loaded onto the data lines DL and DLb may be sequentially transferred to the first cache lines CS_L1 in response to a strobe clock STB_CLK used in the memory device 1100.

When data corresponding to the tenth column address CADD10 is finally transferred to the first storage group, data corresponding to the eleventh column address CADD11 may start to be transferred to the second storage group 54 through the second cache lines CS_L2. In other words, starting from the eleventh column address CADD11, the up-selection signal U_SEL may be disabled and the down-selection signal D_SEL may be enabled. Thus, the switch circuit 51 may couple the data lines DL and DLb to the second storage group 54 through the second cache lines CS_L2.

A data transfer order according to the above-described embodiment is described below in more detail.

Figure 18:
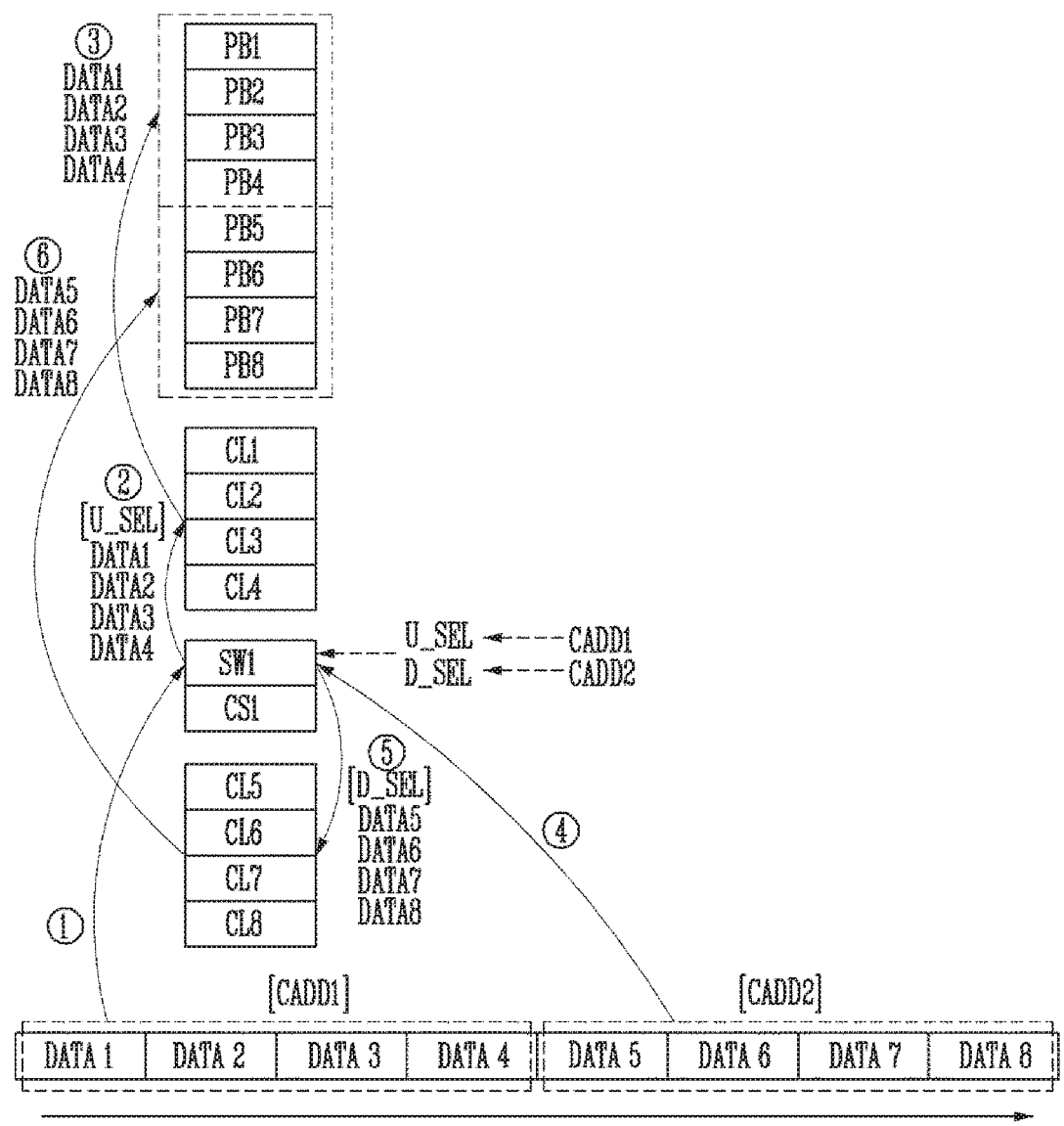
FIG. 18 is a diagram illustrating a data transfer order according to an embodiment of the present disclosure.

FIG. 18 is a diagram illustrating a data transfer order according to an embodiment of the present disclosure.

Referring to FIG. 18, the order in which data are input to first to eighth page buffers PB1 to PB8 arranged in the second direction is described below as an example. Although the eight page buffers PB1 to PB8 are arranged in the second direction as illustrated in FIG. 18, other page buffers may be further arranged in the first direction perpendicular to the second direction. A method of inputting data to the remaining page buffers may be similar to the method of inputting data to the first to eighth page buffers PB1 to PB8.

When first to eighth data DATA1 to DATA8 are sequentially input, the first to fourth data DATA1 to DATA4 may correspond to a first column address group CADD1, and the remaining fifth to eighth data DATA5 to DATA8 may correspond to a second column address group CADD2.

When the first to fourth data DATA1 to DATA4 corresponding to the first column address group CADD1 are input (①), a first column may be selected by the first column selection circuit group CS1. Since the up-selection signal U_SEL is enabled by the first column address group CADD1, the first switch circuit SW1 corresponding to the first column may sequentially transfer the first to fourth data DATA1 to DATA4 to the first to fourth storage latches CL1 to CL4 included in the first storage group (②). The first to fourth data DATA1 to DATA4 transferred to the first to fourth storage latches CL1 to CL4 may be transferred to the first to fourth page buffers PB1 to PB4 (③). When all the first to fourth data DATA1 to DATA4 are transferred to the first to fourth page buffers PB1 to PB4 through the first to fourth storage latches CL1 to CL4, respectively, the fifth to eighth data DATA5 to DATA8 corresponding to the second column address group CADD2 may be transferred (④).

For example, when the fifth to eighth data DATA5 to DATA8 corresponding to the second column address group CADD2 are input (④), the same first column may be selected by the first column selection circuit group CS1. Since the down-selection signal D_SEL is enabled by the second column address group CADD2, the first switch circuit SW1 corresponding to the first column may sequentially transfer the fifth to eighth data DATA5 to DATA8 to the fifth to eighth storage latches CL5 to CL8 included in the second storage group (⑤). The fifth to eighth data DATA5 to DATA8 may be transferred to the fifth to eighth page buffers PB5 to PB8 through the fifth to eighth storage latches CL5 to CL8, respectively (⑥).

Figure 19:
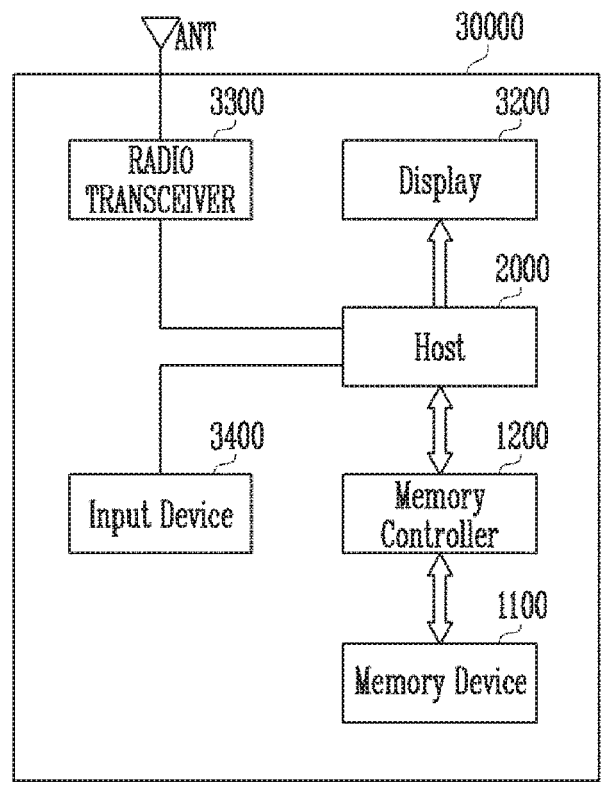
FIG. 19 is a diagram illustrating another embodiment of a memory system shown in FIG. 1.

FIG. 19 is a diagram illustrating another embodiment of the memory system 1000 shown in FIG. 1.

Referring to FIG. 19, a memory system 30000 may be embodied into a cellular phone, a smart phone, a tablet PC, a personal digital assistant (PDA), or a wireless communication device.

The memory system 30000 may include the memory device 1100, the memory controller 1200 controlling operations of the memory device 1100, and the host 2000 controlling the memory controller 1200. The memory controller 1200 may control a data access operation of the memory device 1100, for example, a program operation, an erase operation or a read operation of the memory device 1100 in response to control of the host 2000.

As described above, before requesting an external command to the memory controller 1200, the host 2000 may receive status information of the memory device 1100 and determine whether a memory device in an idle state exists in the memory controller 1100 on the basis of the status information. When it is determined that there is no memory device in the idle state, the host 2000 may cause an external command to wait until a memory device in an idle state occurs.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 into the semiconductor memory device 1100. In addition, the radio transceiver 3300 may change a signal output from the host 2000 into a radio signal and output the radio signal to an external device through the antenna ANT. A control signal for controlling the operations of the host 2000 or data to be processed by the host 2000 may be input by an input device 3400, and the input device 3400 may include a pointing device, such as a touch pad and a computer mouse, a keypad, or a keyboard. The host 2000 may control the operations of the display 3200 so that data output from the memory controller 1200, data output from the radio transceiver 3300, or data output from the input device 3400 may be output through the display 3200.

Figure 20:
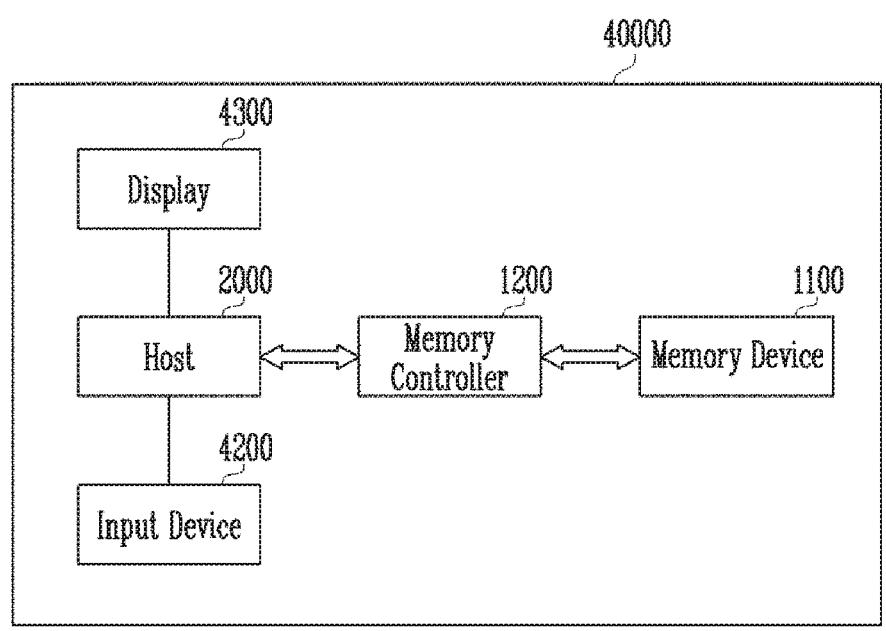
FIG. 20 is a diagram illustrating another embodiment of a memory system shown in FIG. 1.

FIG. 20 is a diagram illustrating another embodiment of the memory system 1000 shown in FIG. 1.

Referring to FIG. 20, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100, the memory controller 1200 controlling data processing operations of the memory device 1100, and the host 2000 controlling the memory controller 1200.

As described above, before requesting an external command to the memory controller 1200, the host 2000 may receive status information of the memory device 1100 and determine whether a memory device in an idle state exists in the memory controller 1100 on the basis of the status information. When it is determined that there is no memory device in the idle state, the host 2000 may cause an external command to wait until a memory device in an idle state occurs.

In addition, the host 2000 may output the data stored in the memory device 1000 through a display 4300 according to the data input through an input device 4200. Examples of the input device 4200 may include a pointing device such as a touch pad or a computer mouse, a keypad, or a keyboard.

The host 2000 may control the general operations of the memory system 40000 and control the operations of the memory controller 1200.

Figure 21:
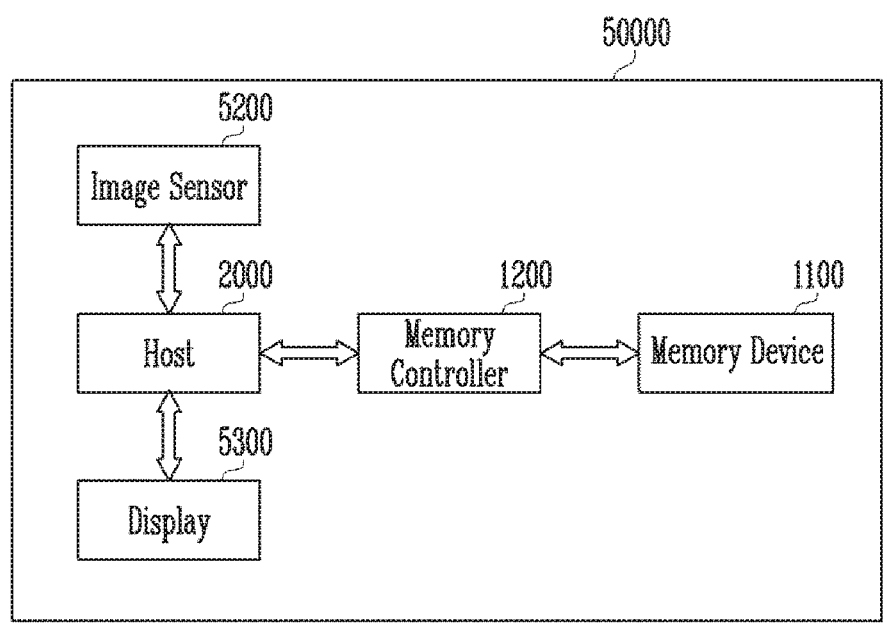
FIG. 21 is a diagram illustrating another embodiment of a memory system shown in FIG. 1.

FIG. 21 is a diagram illustrating another embodiment of the memory system 1000 shown in FIG. 1.

Referring to FIG. 21, a memory system 50000 may be provided as an image processing device, for example, a digital camera, a mobile phone attached with a digital camera, a smart phone attached with a digital camera, or a tablet PC attached with a digital camera.

The memory system 50000 may include the memory device 1100, the memory controller 1200 controlling a data processing operation of the memory device 1100, for example, a program operation, an erase operation or a read operation, and the host 2000 controlling the memory controller 1200.

As described above, before requesting an external command to the memory controller 1200, the host 2000 may receive status information of the memory device 1100 and determine whether a memory device in an idle state exists in the memory controller 1100 on the basis of the status information. When it is determined that there is no memory device in the idle state, the host 2000 may cause an external command to wait until a memory device in an idle state occurs.

An image sensor 5200 of the memory system 50000 may convert an optical image into digital signals, and the converted digital signals may be transferred to the host 2000. In response to control of the host 2000, the converted digital signals may be output through the display 5300 or stored in the memory device 1100 through the memory controller 1200. In addition, the data stored in the memory device 1100 may be output through a display 5300 according to control of the host 2000.

Figure 22:
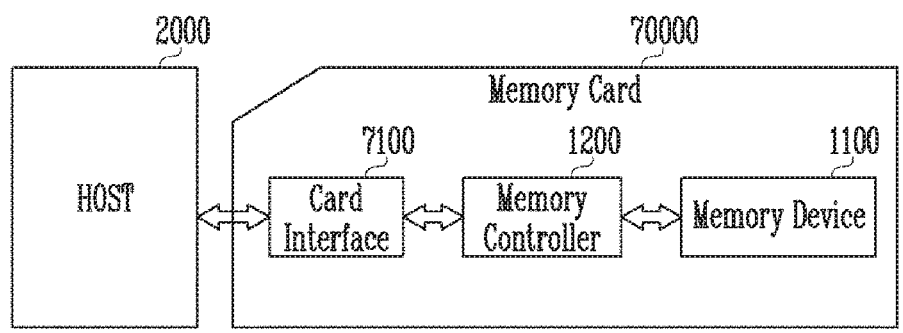
FIG. 22 is a diagram illustrating another embodiment of a memory system shown in FIG. 1.

FIG. 22 is a diagram illustrating another embodiment of the memory system 1000 shown in FIG. 1.

Referring to FIG. 22, a memory system may include a memory card 70000.

The memory card 70000 may be embodied into a smart card. The memory system 70000 may include the memory device 1100, the memory controller 1200 and a card interface 7100.

The memory controller 1200 may control data exchange between the memory device 1100 and the card interface 7100. According to embodiment, the card interface 7100 may be, but not limited to, a secure digital (SD) card interface or a multi-media card (MMC) interface. In addition, the card interface 7100 may interface data exchange between the host 2000 and the memory controller 1200 according to a protocol of the host 2000. In accordance with an embodiment, the card interface 7100 may support a Universal Serial Bus (USB) protocol and an InterChip (IC)-USB protocol. The card interface 7100 may refer to hardware that supports a protocol used by the host 2000, software mounted on the hardware, or a signal transmission method.

According to the present disclosure, since loading time between data lines and storage latches is reduced, a time for an operation using the storage latches may be reduced. Accordingly, performance of a memory device and a memory system having the same may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory device, comprising:
page buffers arranged in a first direction and a second direction perpendicular to the first direction;
a first storage group and a second storage group arranged adjacent to the page buffers in the second direction;
a switch circuit arranged between the first storage group and the second storage group and selectively coupling the first storage group and the second storage group to data lines in response to a first signal and a second signal;
first storage latches that are coupled to the switch circuit through first cache lines; and
second storage latches that are coupled to the switch circuit through second cache lines,
wherein the switch circuit couples the first cache lines and the data lines to each other when the first signal is enabled, and couples the second cache lines and the data lines to each other when the second signal is enabled.

2. The memory device of claim 1,
wherein the page buffers include first page buffers and second page buffers arranged in the first direction, and
wherein the first page buffers and the second page buffers are arranged adjacent to each other in the second direction.

3. The memory device of claim 2, wherein:
the first storage group includes the first storage latches arranged in the first direction, and
the second storage group includes the second storage latches arranged in the first direction.

4. The memory device of claim 3, wherein:
the first storage latches are coupled to the first page buffers, respectively, and
the second storage latches are coupled to the second page buffers, respectively.

5. The memory device of claim 1, wherein cache lines arranged in the second direction, among the first and second cache lines, have a same length.

6. The memory device of claim 1, wherein the first signal and the second signal are selectively enabled according to a column address.

7. The memory device of claim 6, further comprising an operation unit outputting the first signal when data corresponding to a first half of the column address is transferred, and outputting the second signal when data corresponding to a second half of the column address is transferred.

8. The memory device of claim 1, further comprising a column selection circuit activating the switch circuit in response to the column address.

9. The memory device of claim 1, wherein:
storage latches included in the first storage group are arranged in a same manner as upper page buffers of the page buffers, and
storage latches included in the second storage group are arranged in a same manner as lower page buffers of the page buffers.

10. The memory device of claim 9, wherein switches included in the switch circuit are arranged in a same manner as the storage latches included in the first or second storage group.

11. A memory device, comprising:
a memory cell array coupled to a plurality of bit lines spaced apart from each other in a first direction and extending in a second direction perpendicular to the first direction; and peripheral circuits located under the memory cell array in a third direction perpendicular to the first and second directions, wherein the peripheral circuits comprise:

a plurality of page buffers arranged in a matrix format in the first and second directions and coupled to the plurality of bit lines, respectively;

a first storage group coupled to a first group of the page buffers;

a second storage group coupled to a second group of the page buffers; and a switch circuit arranged between and coupled to the first and second storage groups, and coupling the first or second storage group to data lines, first storage latches that are coupled to the switch circuit through first cache lines, and second storage latches that are coupled to the switch circuit through second cache lines, wherein the switch circuit couples the first storage group and the data lines to each other when a first signal is enabled, and couples the second storage group and the data lines to each other when a second signal is enabled.

12. The memory device of claim 11, wherein the first storage group comprises a plurality of storage latches arranged in a matrix format in the first and second directions, and wherein storage latches arranged in the second direction, among the storage latches included in the first storage group, are coupled to page buffers arranged in the second direction, respectively.

13. The memory device of claim 11, wherein the second storage group comprises a plurality of storage latches arranged in a matrix format in the first and second directions, and wherein storage latches arranged in the second direction, among the storage latches included in the second storage group, are coupled to page buffers arranged in the second direction, respectively.

14. The memory device of claim 11, wherein the switch circuit comprises a plurality of switches arranged in a matrix format in the first and second directions.

15. The memory device of claim 11, further comprising a column selection circuit outputting column selection signals in response to a column address.

16. The memory device of claim 15, wherein the switch circuit is activated in response to the column selection signals.

17. The memory device of claim 11, wherein switches included in the switch circuit are arranged in the same manner as storage latches included in the first or second storage group.

18. A memory system, comprising:

a memory device storing data; and a memory controller communicating between a host and the memory device, wherein the memory device comprises:

page buffers arranged in a first direction and a second direction perpendicular to the firfit direction;

a first storage group and a second storage group arranged adjacent to the page buffers in the second direction; and a switch circuit arranged between the first storage group and the second storage group and coupling a selected storage group between the first and second storage groups to data lines, first storage latches that are coupled to the switch circuit through first cache lines, and second storage latches that are coupled to the switch circuit through second cache lines, wherein the switch circuit couples the first storage group and the data lines to each other when a first signal is enabled, and couples the second storage group and the data lines to each other when a second signal is enabled.

* * * * *